US008140039B2

United States Patent
Luong et al.

(10) Patent No.: US 8,140,039 B2
(45) Date of Patent: Mar. 20, 2012

(54) QUADRATURE-INPUT QUADRATURE-OUTPUT DIVIDER AND PHASE LOCKED LOOP FREQUENCY SYNTHESIZER OR SINGLE SIDE BAND MIXER

(75) Inventors: Howard Cam Luong, Kowloon (HK); Hui Zheng, Kowloon (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 1180 days.

(21) Appl. No.: 11/852,702

(22) Filed: Sep. 10, 2007

(65) Prior Publication Data

US 2009/0068975 A1   Mar. 12, 2009

(51) Int. Cl.
*H04B 7/00* (2006.01)
(52) U.S. Cl. ....... 455/260; 455/183.1; 455/76; 455/255; 455/165.1; 455/265; 455/75; 455/147; 455/264; 455/192.1; 455/316; 375/376; 375/344; 375/307; 375/373; 375/375; 327/156; 327/105; 327/47; 327/57; 327/17; 327/18; 327/175; 327/177; 327/147; 327/117; 331/158; 331/175; 331/25; 332/127
(58) Field of Classification Search ............ 455/318, 455/323, 260, 183.1, 76, 255, 165.1, 265, 455/75, 147, 264, 192.1, 316; 375/261, 376, 375/344, 307, 373, 375; 331/46, 158, 175, 331/25; 327/156, 105, 47, 57, 17, 18, 175, 327/177, 147, 117, 162; 332/127, 2, 17, 332/25
See application file for complete search history.

(56) References Cited

U.S. PATENT DOCUMENTS 4,670,674 A   6/1987   Kantorowicz
(Continued)

FOREIGN PATENT DOCUMENTS

JP   6441329   2/1989

OTHER PUBLICATIONS

A. Mazzanti et al.; "Balanced CMOS LC-tank Analog Frequency Dividers for Quadrature LO Generation", IEEE 2005 Custom Integrated Circuits Conference, Jul. 2005, 2005 IEEE, pp. 575-578.

(Continued)

*Primary Examiner* — Junpeng Chen
(74) *Attorney, Agent, or Firm* — Schwabe, Williamson & Wyatt, P.C.

(57) ABSTRACT

The present invention relates to a quadrature divider which may be used in a phase locked loop or frequency synthesizer or with a single side band mixer. According to a preferred embodiment the divider takes a quadrature input and has a quadrature output. The divider has four analog mixers 1, 2, 3 and 4. The first two mixers 1, 2 take the in-phase quadrature input, while the second mixers 3, 4 take the quadrature-phase quadrature input. The outputs and feedback loops of the mixers are properly arranged such that the in-phase and quadrature-phase outputs of the divider have a deterministic phase sequence relationship based on the phase sequence relationship of the corresponding quadrature inputs. Third order harmonics may be minimized or reduced by addition or subtraction of the mixer outputs. As the divider is able to take a quadrature input, there is no need for a dummy divider in the phase locked loop, thus saving space and power.

26 Claims, 18 Drawing Sheets

U.S. PATENT DOCUMENTS

| | | | |
|---|---|---|---|
| 4,695,940 | A | 9/1987 | Rein |
| 6,175,269 | B1 | 1/2001 | Gielis et al. |
| 6,356,594 | B1 * | 3/2002 | Clement et al. ............... 375/261 |
| 6,564,045 | B1 * | 5/2003 | Fransis ......................... 455/318 |
| 6,785,528 | B2 * | 8/2004 | Carpineto .................... 455/323 |
| 7,010,287 | B2 * | 3/2006 | Oh et al. ....................... 455/318 |
| 7,277,683 | B2 * | 10/2007 | Dosanjh et al. ............... 455/209 |
| 2003/0067359 | A1 * | 4/2003 | Darabi et al. .................... 331/46 |
| 2003/0190905 | A1 | 10/2003 | Carpineto |
| 2006/0258299 | A1 | 11/2006 | Widerin |
| 2008/0164916 | A1 * | 7/2008 | Petrovic et al. ............... 327/117 |

OTHER PUBLICATIONS

Lee, Jri et al., "A 40-GHz Frequency Divider in 0.18-μm CMOS Technology"; IEEE Journal of Solid-State Circuits, vol. 39, No. 4, Apr. 2004, pp. 594-601.

Abedin, M. Faisal et al., "Effects of EBG Reflection Phase Profiles on the Input Impedance and Bandwidth of Ultrathin Directional Dipoles", IEEE Transactions on Antennas and Propagation, vol. 53, No. 11, Nov. 2005, pp. 3664-3672.

Yang, Fan, "Reflection Phase Characterizations of the EBG Ground Plane for Low Profile Wire Antenna Applications", IEEE Transactions on Antennas and Propagation, vol. 51, No. 10, Oct. 2003, pp. 2691-2701.

Sievenpiper, Dan et al., "High-Impedance Electromagnetic Surfaces with a Forbidden Frequency Band", IEEE Transactions on Microwave Theory and Technologies, vol. 47, No. 11, Nov. 1999, pp. 2059-2074.

International Search Report & Written Opinion, issued in International Patent Application No. PCT/CN2008/072303, mailed Dec. 18, 2008, 6 pages.

International Preliminary Report on Patentability, issued in International Patent Application No. PCT/CN2008/072303, mailed Mar. 16, 2010, 5 pages.

* cited by examiner

QUADRATURE-INPUT QUADRATURE-OUTPUT DIVIDER AND PHASE LOCKED LOOP FREQUENCY SYNTHESIZER OR SINGLE SIDE BAND MIXER

FIELD OF THE INVENTION

The present invention relates to a frequency divider.

BACKGROUND TO THE INVENTION

Frequency dividers are one of the most essential building blocks in phase-locked loops (PLLs) and frequency synthesizers, which are required in all data and telecommunication communication systems. As illustrated in FIG. 1, to lock the phase or frequency of the PLLs or synthesizers, frequency dividers are needed to divide down the high frequency output from VCO and feed-back the signal to a PFD (phase/frequency detector). This is because the PFD can usually only accept frequencies which are much lower than the frequency output by the VCO in most applications.

On the other hand, quadrature-phase clock signals are widely required in many applications, for example direct-conversion wireless systems for in-phase and quadrature-phase (IQ) mixing. In particular, in frequency synthesizers for UWB transceivers, many quadrature signals are needed to generate desired LO signals by single-sideband (SSB) mixing. In addition, SSB (single-sideband) mixers require accurate quadrature inputs so as to perform output additions or subtractions with high sideband or image rejection.

A common and reliable solution is to use divide-by-2 circuitries to generate desired IQ signals with quadrature phases, as shown in FIG. 2. The divide-by-2 divider takes a simple signal, halves the frequency and converts it into quadrature outputs (two outputs, foutI—the 'in-phase signal' and foutQ 'the quadrature-phase signal' which is 90 degrees advanced or delayed in phase compared to the 'in-phase signal'). The frequency of the divider's outputs is half of that of the input signals.

However, the output phase matching of the existing quadrature signal generators (quadrature VCOs, or divide-by-2 dividers) is still limited in practical applications. One of the critical contributions to the output IQ phase mismatch of a quadrature signal generator is the mismatch in its output loading, which typically is dominated by the input capacitance of dividers used to achieve lower frequency. In all the existing dividers, only differential input signals are used to achieve divided-by-2 operation. Therefore, an identical dummy divider is normally implemented to balance the IQ loading of the previous quadrature signal generator, as explained in FIG. 3. Nevertheless, there would still exist significant capacitive loading mismatch if the dummy divider were disabled to save power consumption. Alternatively, the dummy divider could be turned on to improve the IQ loading matching, but that would double the power consumption. In either case, the chip area needs to be doubled due to the dummy divider. Another problem with the configuration shown in FIG. 3 is that there is no deterministic relationship between the IQ phase sequence of the input signals and the IQ phase sequence of the output quadrature signals. The relationship is random and dependent on the device parameters in a non-predictable manner.

SUMMARY OF PRIOR ART

The differential source-coupled logic (SCL) frequency divider is generally recognized as the fastest divider topology and it is realized by cascading two D-latch stages as shown in FIG. 6. Two D-latch stages are cascaded with the output of the second stage cross-coupled to the input of the first stage to perform a divided-by-2 function. Each of the two D-latches consists of a cross-coupled pair (Ml) connected in a positive feedback configuration to provide negative transconductance to maximize the operation frequency. Each D-latch is driven by a single clock with two complementary clock phases, one of which is used to control the flipping circuits formed by Ms and the other to control latching circuits formed by Ml. The pull-up network formed by PMOS devices Mp is connected from VDD to the outputs as the load. Once the clock signal is high, Ms start switching on and off based on the differential input signals D and Db. One of the output nodes Q or Qb is discharged through the latching circuits. The opposite output node is charged up as the signal path through PMOS providing a relative low impedance. When the clock signals is low, Ms are off while Ml latch the outputs and keep the stage of the outputs until the clock signals is high again. The SCL divider manifests itself in providing IQ output with high phase accuracy, which is widely adopted for quadrature signals generation.

The regenerative divider (Miller) consists of an analog multiplier and a feedback loop from the output to the multiplier's second input, as illustrated in FIG. 7. Under the following phase and gain conditions, the component at ω survives and circulates around the loop: 1) The total phase shift around the loop at the operation frequency or must be zero; 2) The loop gain at ω must be at least unity; and 3) There is enough suppression of the third harmonics. Assuming that the phase shift introduced by the load is β, the multiplier is required to introduce another phase shift α so that α+β=0.

FIG. 8 shows one example of the Miller divider. The differential input signals are applied at switched transistors of the classical Gilbert cell, while the differential output signals of the divider are fed-back to the bottle transistors of the mixer. LC Tanks are implemented as load to filter out the $3^{rd}$ order harmonic to maintain the proper operation of the divider. This kind of divider has the characteristic of differential-input and differential-output.

The multiplier-based regenerative quadrature divider includes a first analog mixer for receiving input signal at a predetermined frequency at a first input of the first mixer, and a second analog mixer for receiving the input signal with an 180° phase shift at a first input of the second mixer. As explained in FIG. 9, the output of the first mixer is coupled back to a second input of the first mixer and the output of the second mixer is fed-back to a second input of the second mixer. Since the input to the second mixer is phase shifted by 180°, the resultant phase shift in the outputs of the second mixer will be 90°. Thus, quadrature signals are realized, and it has differential-input quadrature-output feature compared with original Miller divider.

As can be seen from the above, the existing analog dividers are either differential-input differential-output or differential-input quadrature-output. Furthermore, as previously mentioned, when these kinds of dividers are applied to divide down the frequency from a quadrature signal generator, an identical dummy divider must be used as explained in FIG. 3. However, while a dummy divider can help achieve matched input loading, it doubles the power consumption and doubles the size of the chip.

SUMMARY OF THE INVENTION

In light of the above, a new kind of divider, which can fully utilize quadrature input, is desired. It would also be desirable to have a divider which can utilize quadrature input and output a signal which has a deterministic relationship between the phase sequence of the input signals and the phase sequence of the output signals. In this way, assuming the phase sequence of the input signals is known, it can be known in advance which of the output quadrature signals will lead and which will lag. The 'phase sequence' of the quadrature signals is the phase relationship between the two signals, e.g. which signal leads and which signal lags and by how much. In addition, the divider will preferably have better matched input loading and use less power compared to conventional dividers.

A schematic example of a PLL with a quadrature input divider is shown in FIG. 4. Both the IQ output signals output from the quadrature signals generator are utilized by the quadrature input divider.

Furthermore, for some particular applications, such as a UWB system, multiple frequencies with quadrature signals are needed. So, it would be desirable for a new quadrature input divider to be able to deliver quadrature signals at output. In addition, identifiable quadrature phase sequence relationship between these quadrature signals at different frequencies should be supported, since SSB mixers also require deterministic quadrature phase sequence at the inputs to achieve the correct upper-sideband or lower-sideband operation. As illustrated in FIG. 5, such a new kind of quadrature-input quadrature-output divider (QIQOD) could be applied to generate quadrature signals train with multiple frequencies.

Preferred embodiments of the present invention have a divider with double-balanced quadrature-input quadrature-output and preferably have negligible $3^{rd}$ order harmonic compared with conventional dividers. The invented quadrature-input quadrature-output divider (QIQOD) preferably provides a mechanism to achieve an output IQ phase sequence that is inherently tracked with the input IQ phase sequence. The present invention preferably reduces the capacitive load to a quadrature signal generator while simultaneously achieving better IQ loading matching.

A first aspect of the present invention provides a quadrature-input quadrature-output divider comprising:
  a) an in-phase input for receiving an in-phase input signal
  b) a quadrature-phase input for receiving a quadrature phase input signal;
  c) an in-phase output for outputting an in-phase signal;
  d) a quadrature-phase output for outputting a quadrature-phase signal; and
  e) first, second, third and fourth analog mixers, each having first and second inputs and an output;
    wherein the first input of the first analog mixer is arranged to receive the in-phase input signal;
    the first input of the second analog mixer is arranged to receive the in-phase input signal;
    the first input of the third analog mixer is arranged to receive the quadrature-phase input;
    the first input of the fourth analog mixer is arranged to receive the quadrature-phase input signal;
and wherein, the output of the first mixer is fed back to the second input of the first mixer; the output of the second mixer is fed back to the second input of the second mixer; wherein the signal input to one of the first and second inputs of the second mixer is phase shifted by 180 degrees; wherein the output of the third mixer is tied together with the output of the first mixer and the combined signal from the first and third mixers is directed to the in-phase output of the divider, and fed back to the second input of the fourth mixer; and the output of the fourth mixer is combined with the output of the second mixer and the combined output of the second and fourth mixers is directed to the quadrature-phase output of the divider, and fed-back to the second input of the third mixer.

In general the quadrature-phase input signal will be advanced or delayed by 90° relative to the phase of the in-phase input signal by 90°. Likewise, the quadrature-phase output signal should be advanced or delayed by 90° relative to the phase of the in-phase output signal.

The analogue mixers may be arranged to receive a signal at a predetermined frequency at their first inputs.

In the divider of the present invention, the phase sequence (lagging of leading between the phases of the two outputs) of the quadrature outputs tracks the phase sequence of the quadrature inputs deterministically. Thus if the phase sequence of the quadrature inputs is known, then the phase sequence of the quadrature outputs can be predicted in advance. E.g. if one of the two IQ inputs leads (or lags) the other input, it can be determined which one of the two IQ inputs leads (or lags) the other output. As a consequence, an engineer can figure out how to properly connect the IQ inputs and IQ outputs to single-sideband mixers for correct operation. This feature is very useful for practical applications and for proper operation of single-side band mixers whose two input signals are the IQ inputs and IQ outputs of the proposed dividers.

The third order harmonics at the quadrature-phase and in-phase outputs in the above circuit may be substantially eliminated by addition and/or subtraction of the outputs of the mixers.

The feed back to the second inputs of the various mixers t may be directly or via other components, such as an inverter or other arrangement for shifting the phase of the signal by 180 degrees.

As noted above, the signal input to one of the first and second inputs of the second mixer is phase shifted by 180 degrees. This may, for example, be achieved by placing an inverter between the in-phase input and the second mixer's first input or an inverter on the feedback line to the first mixer's second input.

The divider may be designed to accept a differential signal, in which case the in-phase and quadrature-phase inputs and outputs of the divider may be differential inputs and outputs and the inputs and outputs of the mixers may be differential inputs and outputs.

Where there is a differential configuration, the differential output of the second mixer may be cross-coupled to the second differential input of the second mixer in order to shift the phase of the signal input to the second (differential) input of the second mixer by 180 degrees.

Where there is a differential configuration, the differential in-phase input of the divider may be cross-coupled to the first differential input of the second mixer in order to shift the phase by 180 degrees.

The analogue mixers may be Gilbert-Cell mixers. Where the divider has a differential arrangement the mixers may be differential Gilbert-Cell mixers Each Gilber-Cell mixer may comprise a bottom transistor and a pair of switching transistors. The bottom transistor may be a transistor which is coupled to each of the switching transistors. For example, the emitters of the switching transistors may be coupled to the collector of the bottom transistor.

The quadrature-phase and in-phase inputs may be coupled to the bottom transistors of the mixers. The quadrature-phase and in-phase outputs may be coupled to the switching transistors of the mixers.

The divider may be arranged to receive the input in-phase and quadrature-phase signals at a predetermined frequency double the output frequency of the divider.

The arrangement of transistors may output to an inductive or resistive load. A current bias source may be connected a command node connecting the bottom transistors.

In an alternative arrangement the quadrature-phase and in-phase inputs may be coupled to the switching transistors of the mixers and the quadrature-phase and in-phase outputs may be coupled to the bottom transistors of the mixers.

The bottom transistors of the first and second mixers may be combined so that a single bottom transistor acts for both the first and second mixers. Alternatively each mixer may have a separate bottom transistor.

The bottom transistors of the third and fourth mixers may be combined so that a single bottom transistor acts for both the first and second mixers. Alternatively each mixer may have a separate bottom transistor.

Any of the features of the first aspect of the present invention discussed above may be combined together.

A second aspect of the present invention provides a phase locked loop or synthesizer comprising a voltage controlled oscillator and a feedback loop; wherein the phase locked loop or synthesizer is configured to output a quadrature signal and wherein the feedback loop comprises one or more quadrature-input quadrature-output dividers. By "quadrature-input quadrature-output divider" it is meant that the divider is configured to accept a quadrature input (comprising an in-phase signal and a quadrature-phase signal) and to output a quadrature output (comprising an in-phase signal and a quadrature-phase signal).

The or each quadrature-input quadrature-output divider (QIQO divider) is preferably a divider according to the first aspect of the present invention.

The VCO may be a quadrature VCO (QVCO) which outputs quadrature signals (comprising a quadrature-phase signal and an in-phase signal).

The VCO output may be coupled to a quadrature signal generator. In this case the output of the quadrature signal generator is coupled to the output of the PLL or synthesizer and to the quadrature-in quadrature-out divider of the feed back loop. The quadrature signal generator may be a divided-by-two circuit which divides the frequency by two, a divided-by-three circuit which divides the frequency by three, or any other type of quadrature signal generators. It is not necessary that the quadrature signal generator divides the frequency as long as it outputs quadrature signals.

A third aspect of the present invention provides a circuit comprising a single side band (SSB) mixer and a quadrature input quadrature output (QIQO) divider; wherein the SSB has a first quadrature input adapted to receive a first quadrature signal and a second quadrature input adapted to receive a second quadrature signal; wherein the circuit is arranged such that said first quadrature signal is input to both the first quadrature input of the SSB and the quadrature input of the QIQO divider and wherein the quadrature output of the QIQO divider forms the second quadrature signal which is input to the second quadrature input of the SSB.

The first quadrature signal comprises both an in-phase signal and a quadrature-phase signal. The second quadrature signal also comprises an in-phase signal and a quadrature-phase signal.

The QIQO divider may be a QIQO divider according to the first aspect of the present invention.

Unless logic, or the context, demands otherwise, the third aspect of the present invention may be combined with any of the features of the first and second aspects of the present invention discussed above.

DETAILED DESCRIPTION

Figure 10:
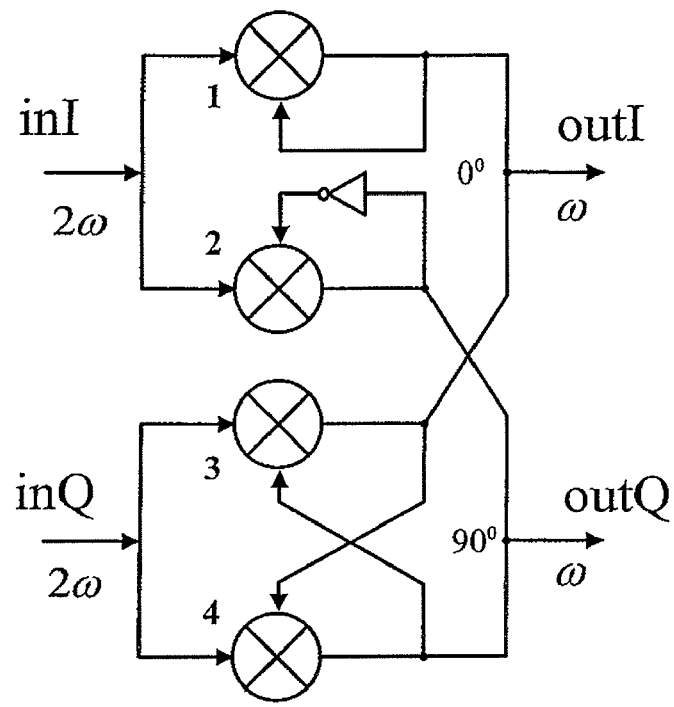
FIG. 10 shows a first example of a quadrature-input quadrature-output (QIQO) divider.

In a first embodiment of the present invention, a QIQO divider includes four analog mixers and four different feedback loops from output to one side of the mixers with appropriate phase shifts respectively, as illustrated in FIG. 10. First 1 and second 2 analog mixers receive in-phase input signal at a predetermined frequency at first input of the mixers; third 3 and fourth 4 analog mixers receive the quadrature-phase input signal at first input of the mixers; wherein, the output of the first mixer 1 is fed-back to the second input of the first mixer 1; the output of the second mixer 2 is coupled to the second input of the second mixer 2 after a 180° phase shift; the output of the third mixer 3 is tied together with the output of the first mixer 1 to form the in-phase output of the divider, and then coupled to the second input of the fourth mixer 4; similarly, the output of the fourth mixer 4 is combined with the output of the second mixer 2 to form the quadrature-phase output of the divider, and then fed-back to the second input of the third mixer.

Figure 1:
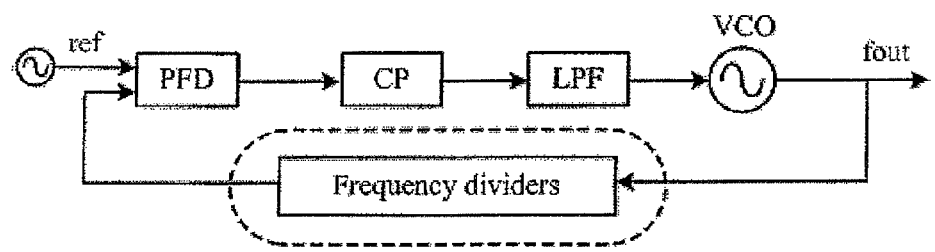
FIG. 1 shows a phase locked loop with frequency dividers and has been described above.
Figure 2:
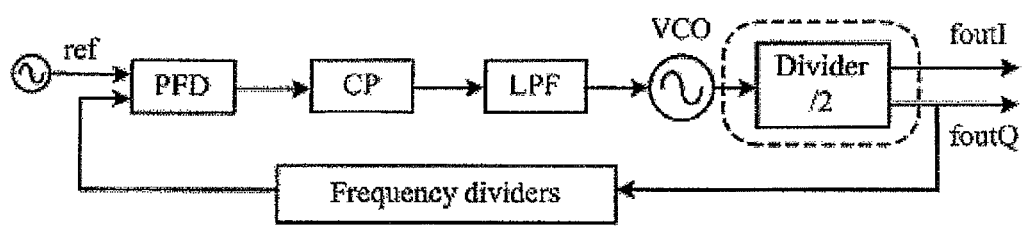
FIG. 2 shows a phase locked loop with a quadrature output and has been described above.
Figure 3:
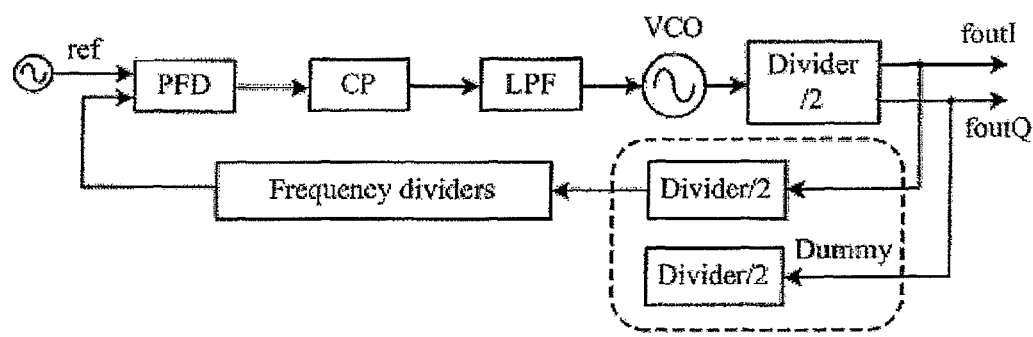
FIG. 3 shows a phase locked loop with quadrature output and a quadrature output and a dummy divider on the feed back loop, and has been described above.
Figure 4:
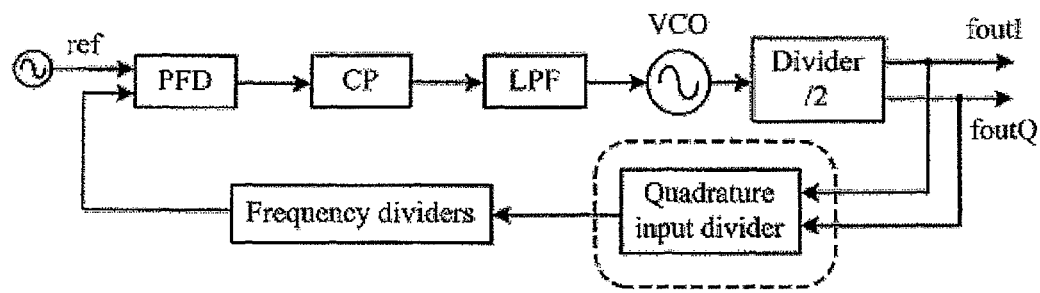
FIG. 4 shows a phase locked loop with quadrature output and a quadrature input divider on the feedback loop.
Figure 5:
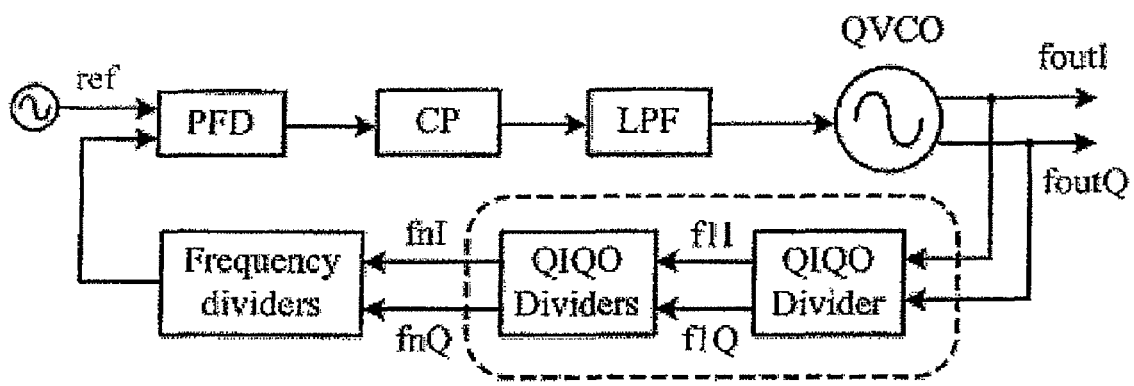
FIG. 5 shows a phase locked loop with a quadrature output and a plurality of quadrature-input quadrature-output dividers on the feedback loop.
Figure 6:
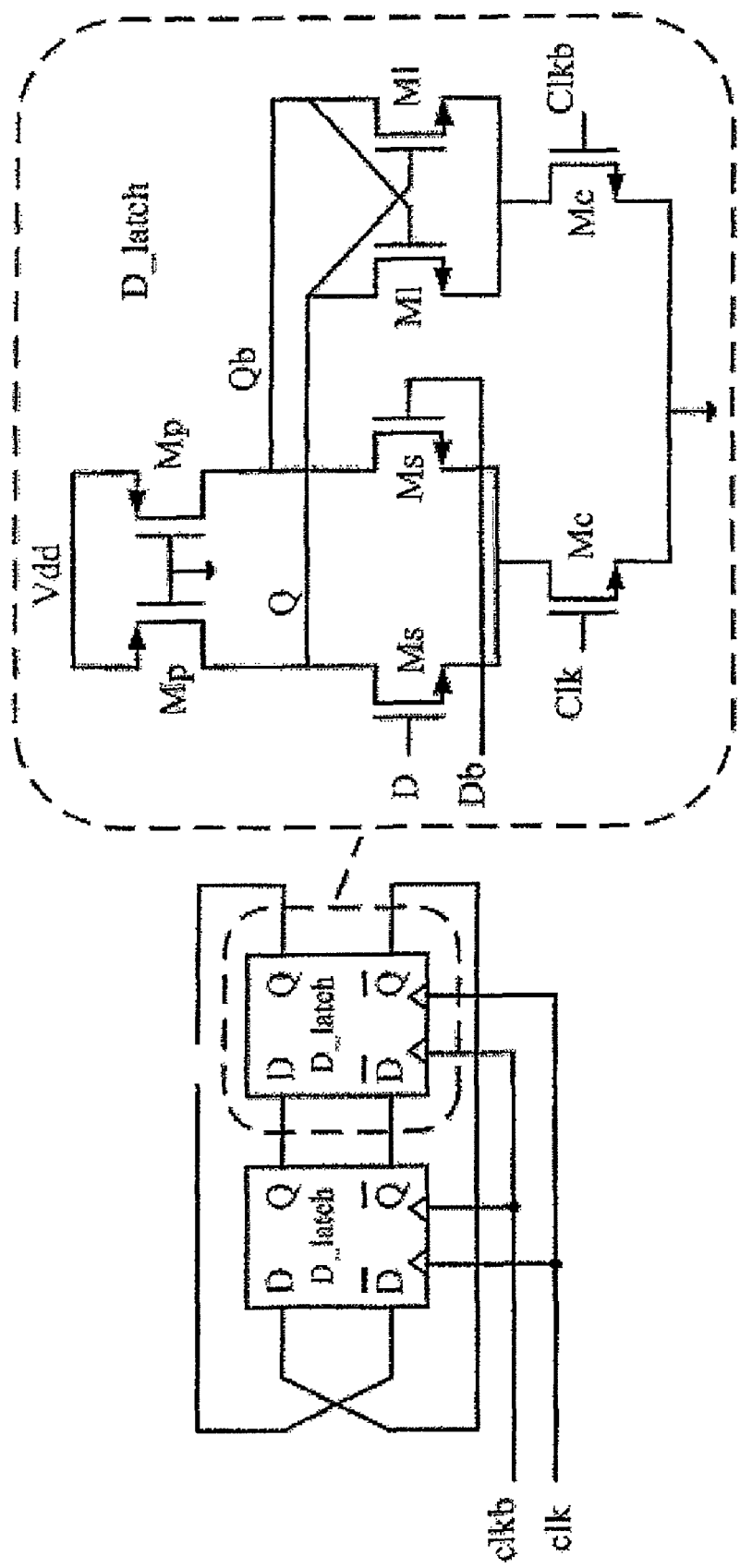
FIG. 6 shows a source coupled logic frequency divider having two cascading D latch stages.
Figure 7:
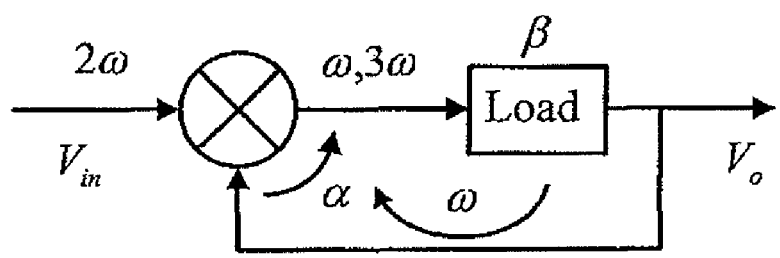
FIG. 7 shows a Miller divider.
Figure 8:
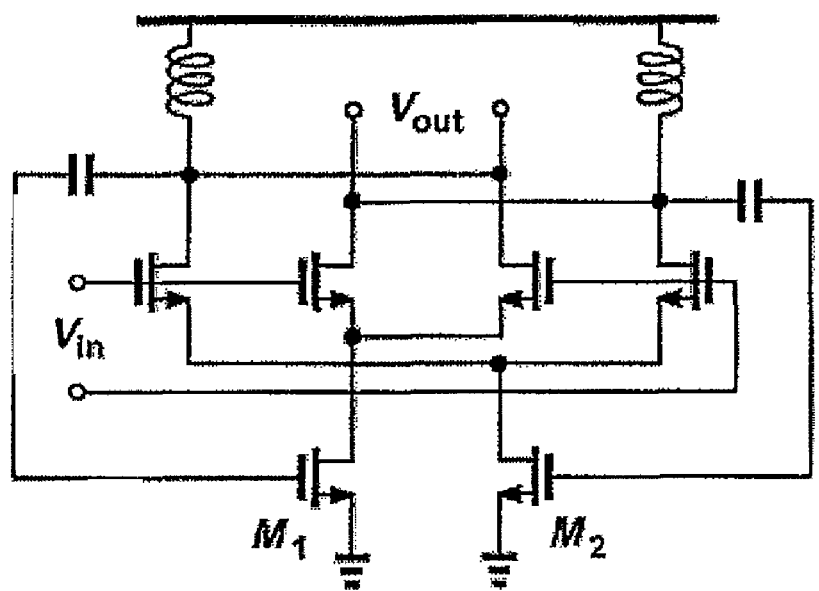
FIG. 8 shows a Miller divider realised by use of a Gilbert Cell.
Figure 9:
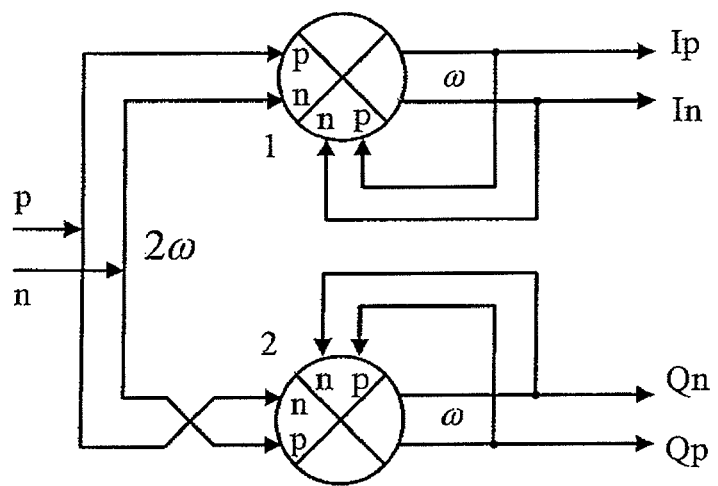
FIG. 9 shows a simple input quadrature output divider employing two analog mixers.

The basic principle of the invention is based on the multiplier-based regenerative divider (Miller). As shown in FIG. 7, in order for a Miller divider to operate properly, the following conditions are necessary: 1) The total phase shift around the loop at the operation frequency ω must be zero; 2) The loop gain at ω must be at least unity; and 3) There is enough suppression of the third harmonics. Assuming that the phase shift introduced by the load is β, the multiplier is required to introduce another phase shift α so that α+β=0.

Figure 11:
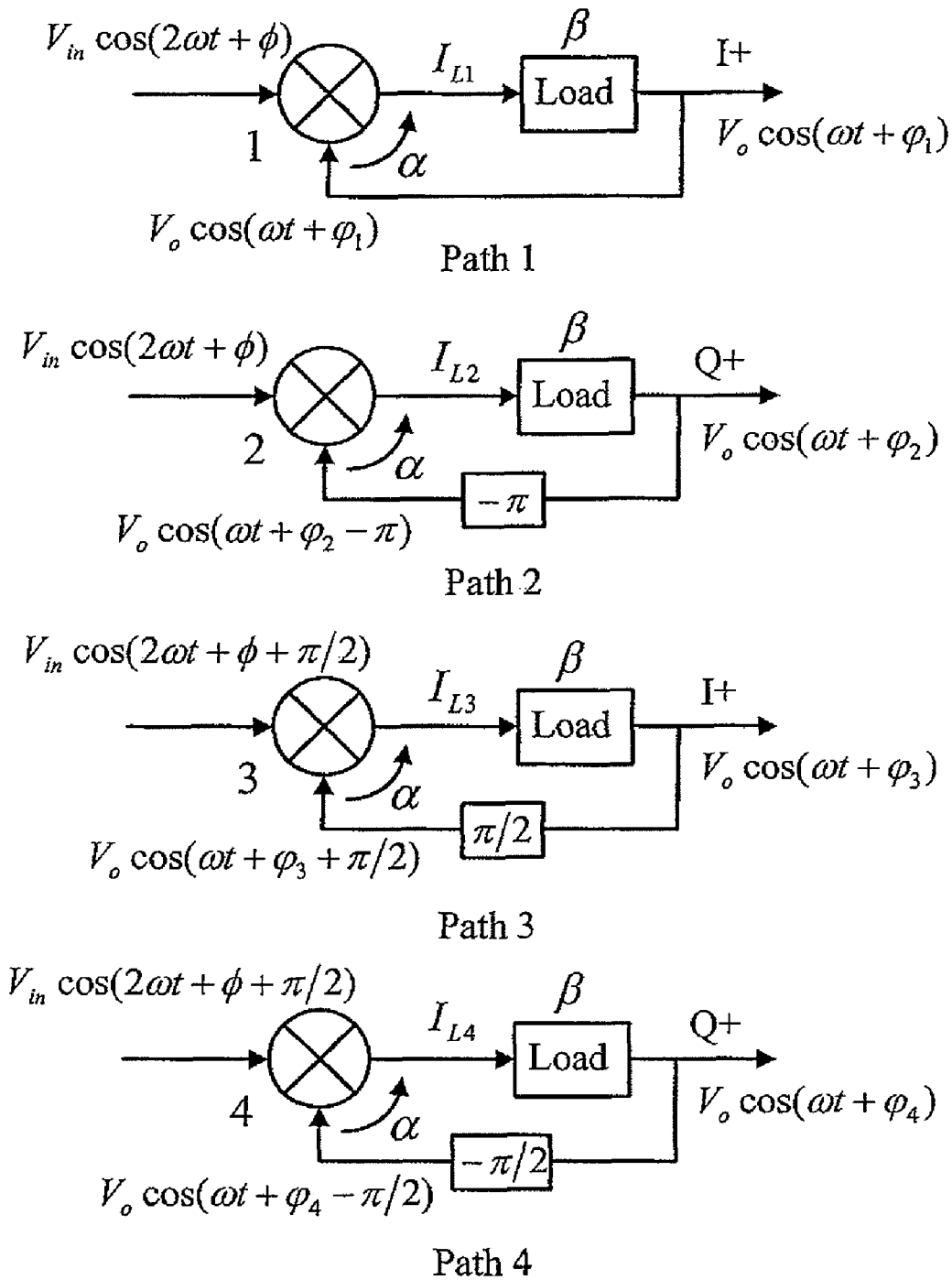
FIG. 11 shows an analysis of the signal paths of FIG. 10.

To fully understand the operation and the features of the invented QIQOD, the current invention is decomposed into four closed feed-back loops each with an analog mixer and a feed-back path with appropriate phase shift. Without loss of generality, it can be assumed that the input inI lags the input in Q by 90°, and the input signals are represented by $V_{in}\cos(2\omega t+\phi)$ and $V_{in}\cos(2\omega t+\phi+\pi/2)$ respectively. Here, $\phi$ denotes the initial phase of the input signal. The output signal at each path is expressed by $V_o\cos(\omega t+\phi_i)$ with an arbitrary phase $\phi_i$ as shown in FIG. 11.

In Path 1, the output signal is fed-back to the multiplier directly with zero phase shift. The output current is expressed by $$I_{L1} = V_{in}V_o\cos(2\omega t+\phi)\cos(\omega t+\varphi_1) \tag{1}$$
$$= \frac{1}{2}V_{in}V_o[\cos(3\omega t+\phi+\varphi_1)+\cos(\omega t+\phi-\varphi_1)]$$

Equation (1) shows the phase shift contributed by the multiplier (α) is $\phi-2\phi_1$ which is required to compensate the phase shift β introduced by the load. As a consequence, $$\phi-2\phi_1+\beta=0 \tag{2}$$

The output phase at Path 1 is hence given by $$\phi_1=(\beta+\phi)/2 \tag{3}$$

In contrast to Path 1, an 180° phase shift is intentionally added to Path 2. The phase shift can be either negative or positive. First, assuming that the phase shift is negative, the output current of the multiplier 2 can be derived as $$I_{L2} = V_{in}V_o\cos(2\omega t+\phi)\cos(\omega t+\varphi_2-\pi) \tag{4}$$
$$= \frac{1}{2}V_{in}V_o[\cos(3\omega t+\phi+\varphi_2-\pi)+\cos(\omega t+\phi-\varphi_2+\pi)]$$

which yields an output phase $$\phi_2=(\beta+\phi)/2+\pi/2=\phi_1+\pi/2 \tag{5}$$

Consequently, (4) is modified to $$I_{L2} = \frac{1}{2}V_{in}V_o[\cos(3\omega t+\phi+\varphi_1-\pi/2)+\cos(\omega t+\phi-\varphi_1+\pi/2)] \tag{6}$$

As another possibility, the phase shift in Path 2 can also be +180° instead of −180°, in which case the output phase becomes:

$$\phi_2=(\beta+\phi)/2-\pi/2=\phi_1-\pi/2 \tag{7}$$

From Equations (1), (6), and (7), the quadrature outputs are readily achieved and available from the outputs of Path 1 and Path 2.

The multipliers in Paths 3 and 4 are cross-coupled to provide a 90° phase shift in the feedback paths. And the output of Path 3 is tied to the outI output of Path 1.

If the output Q signal lags the output I signal by 90°, the third path becomes $$I_{L3} = V_{in}V_o\cos(2\omega t+\phi+\pi/2)\cos(\omega t+\varphi_3-\pi/2) \tag{8}$$
$$= \frac{1}{2}V_{in}V_o[\cos(3\omega t+\phi+\varphi_3)+\cos(\omega t+\phi-\varphi_3+\pi)]$$

And $$\varphi_3 = (\beta+\phi)/2+\pi/2 \neq \varphi_1 \tag{9}$$

On the other hand, if the output Q signal leads the output I signal by 90°, Equation (8) can be rewritten as $$I_{L3} = V_{in}V_o\cos(2\omega t+\phi+\pi/2)\cos(\omega t+\varphi_3+\pi/2) \tag{10}$$
$$= \frac{1}{2}V_{in}V_o[\cos(3\omega t+\phi+\varphi_3+\pi)+\cos(\omega t+\phi-\varphi_3)]$$

Similarly, we have $$\phi_3=(\beta+\phi)/2=\phi_1 \tag{11}$$

In this case, Path 1 and Path 3 can have the same phase and contribute larger loop gain, which forces the Q signal to lead the I signal by 90°. Consequently, $$I_{L3} = \frac{1}{2}V_{in}V_o[\cos(3\omega t+\phi+\varphi_1+\pi)+\cos(\omega t+\phi-\varphi_1)] \tag{12}$$

Applying the same analysis for Path 4, $$I_{L4} = V_{in}V_o\cos(2\omega t+\phi+\pi/2)\cos(\omega t+\varphi_4-\pi/2) \tag{13}$$
$$= \frac{1}{2}V_{in}V_o[\cos(3\omega t+\phi+\varphi_4)+\cos(\omega t+\phi-\varphi_4+\pi)]$$
$$= \frac{1}{2}V_{in}V_o[\cos(3\omega t+\phi+\varphi_1+\pi/2)+\cos(\omega t+\phi-\varphi_1+\pi/2)]$$

By adding the output of Path 1 (1) and Path 3 (12), Path 2 (6) and Path 4 (13) respectively, the $3^{rd}$ harmonic term can be eliminated. We have $$I_{L1}+I_{L3}=V_{in}V_o\cos(\omega t+\phi-\phi_1)=V_{in}V_o\cos(\omega t+\phi/2-\beta/2) \tag{14}$$

$$I_{L2}+I_{L4}=V_{in}V_o\cos(\omega t+\phi/2-\beta/2+\pi/2) \tag{15}$$

From Eqs. (14) and (15), the IQ phase sequence of the outputs is inherently tracking the IQ phase sequence of the input signals. As expressed by (5) and (7), the conventional divider employing only Paths 1 and 2 generates the quadrature outputs with random phase sequence. This is a potential problem in conventional Miller dividers. However, the problem is completely eliminated in the invented QIQO divider with the addition of the third and fourth paths that are used to control the phase sequence.

For existing Miller dividers, a narrow band LC tank or a low-pass filter needs to be included to suppress the $3^{rd}$ harmonics in order to enable the divider to operate properly. In contrast, in the present embodiment of the QIQOD, thanks to the single-sideband operation, the third-order terms are automatically eliminated by properly adding the outputs. In other words, the third necessary condition for the divider to function properly is automatically satisfied without any filter. Therefore, a loop gain being larger than unity is the only required condition that limits the divider operation range. In this aspect, the invented QIQOD also performs better because both the I and Q signals from the quadrature signal generator are fully utilized to contribute to the loop gain. As such, compared with conventional design, the input transistors size and the power consumption of the current invention can be two times smaller to keep the same output amplitude, which further reduces the loading to the quadrature signal generator and enhances the loading matching.

Figure 12:
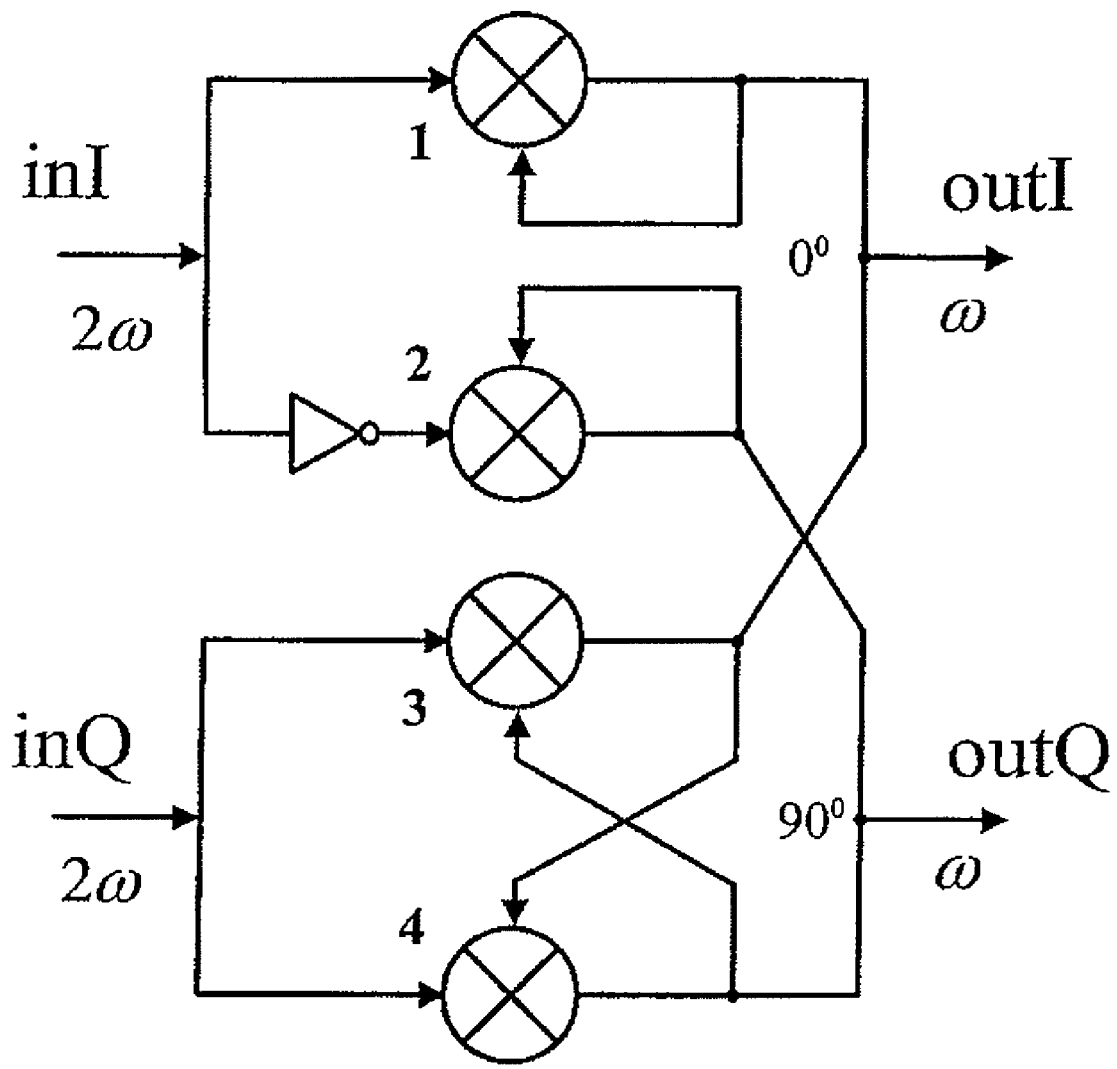
FIG. 12 shows a second example of a QIQO divider.

FIG. 12 illustrates a second configuration of the present invention. A first analog mixer 1 receives an in-phase input signal at a predetermined frequency at a first input of the first mixer; a second analog mixer 2 receives an in-phase input signal with a 180° phase shift at first input of the second mixer; third 3 and fourth 4 analog mixers receive the quadrature-phase input signal at first input of the mixers; wherein, the output of the first mixer 1 is fed-back to the second input of the first mixer 1; the output of the second mixer 2 is coupled to the second input of the second mixer 2; the output of the third mixer 3 is tied together with the output of the first mixer 1 to form the in-phase output of the divider, and then coupled to the second input of the fourth mixer 4; similarly, the output of the fourth mixer 4 is combined with the output of the second mixer 2 to form the quadrature-phase output of the divider, and then fed-back to the second input of the third mixer 3.

The operation is the same as that described in FIG. 11.

The analog mixers can be any of mixer designs with first input and second input, such as a Gilbert Cell mixer or similar design.

Figure 13:
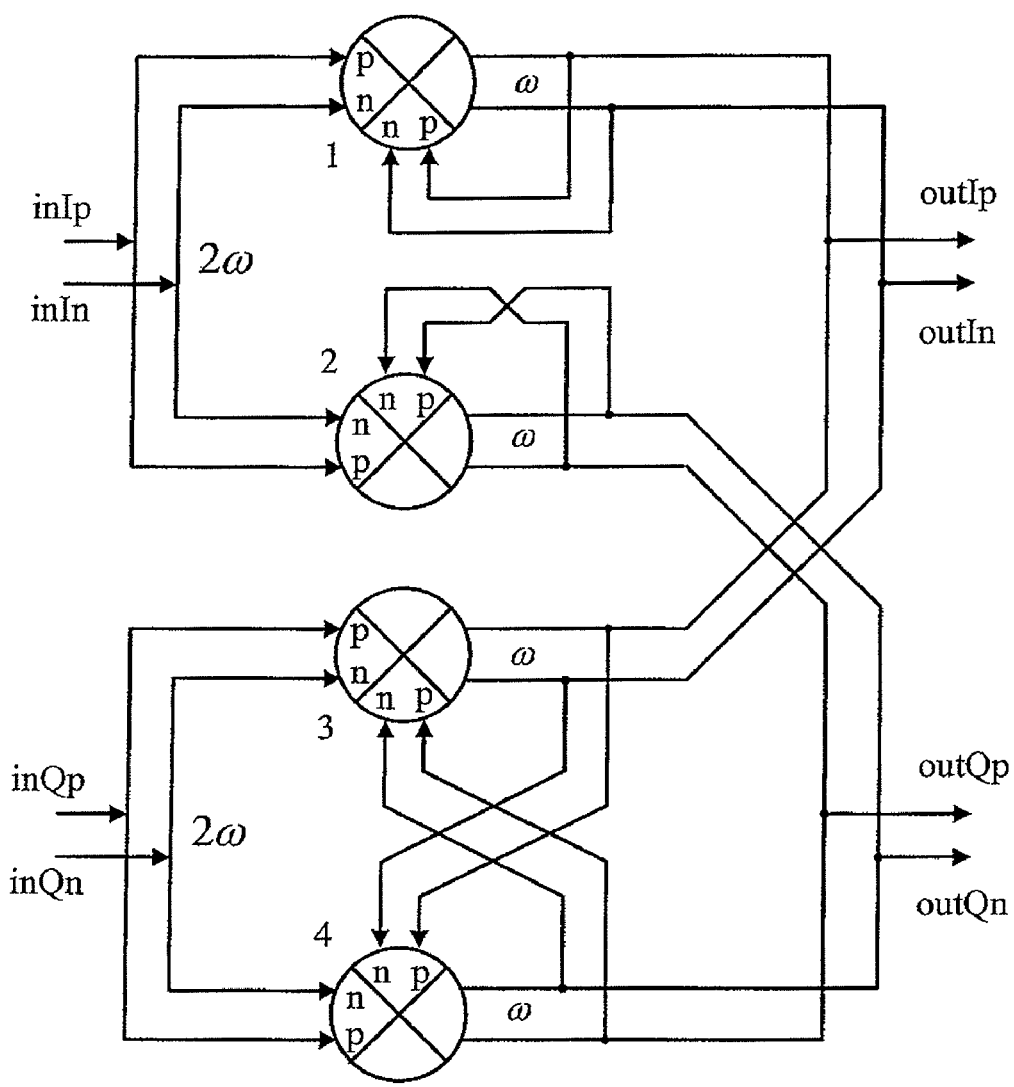
FIG. 13 shows a third example of a QIQO divider, this time with differential inputs and outputs.

FIG. 13 illustrates a differential prototype of the present invention of the QIQOD. A first and a second differential analog mixers receive in-phase input signals at a predetermined frequency at first inputs of the mixers; a third and a fourth differential analog mixers receive the quadrature-phase input signals at first inputs of the mixers; wherein, the outputs of the first mixer are fed-back to the second inputs of the first mixer; the outputs of the second mixer are cross-coupled to the second inputs of the second mixer by swapping the differential feed-back paths; the outputs of the third mixer are tied together with the outputs of the first mixer to form the in-phase outputs of the divider, and then coupled to the second inputs of the fourth mixer; similarly, the outputs of the fourth mixer are combined with the outputs of the second mixer to form the quadrature-phase outputs of the divider, and then fed-back to the second inputs of the third mixer.

The operation is the same as that described in FIG. 11 except that differential analog mixer and differential signals are used.

Figure 14:
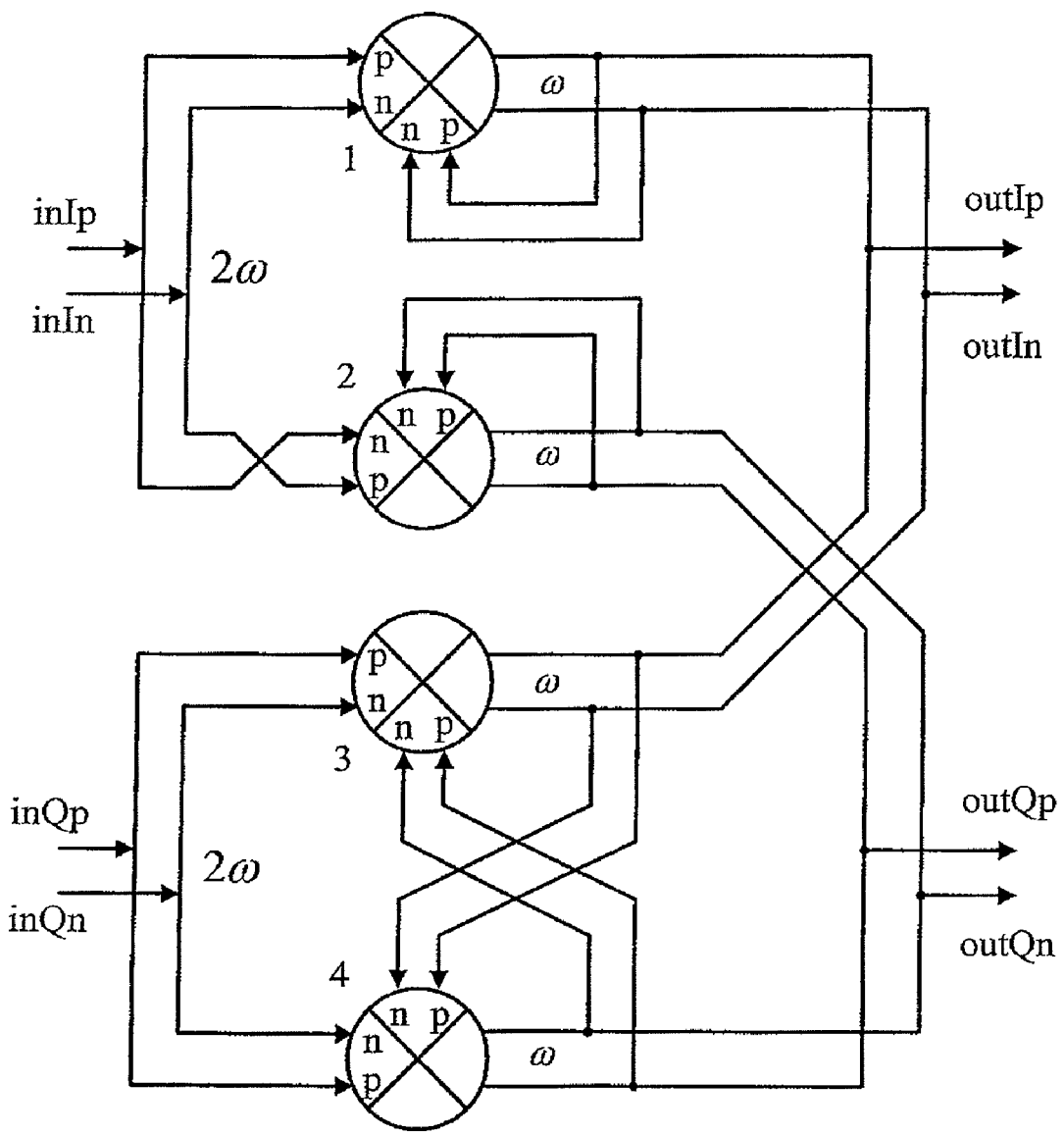
FIG. 14 shows a fourth example of a QIQO divider, this time with differential inputs and outputs.

FIG. 14 illustrates a second differential configuration of the present invention of the QIQOD. A first differential analog mixer receive in-phase input signals at a predetermined frequency at first inputs of the first mixer; a second differential analog mixer receive in-phase input signals with 180° phase shift at first inputs of the second mixer by swapping the differential input signals; a third and a fourth differential analog mixers receive the quadrature-phase input signals at first inputs of the mixers; wherein, the outputs of the first mixer are fed-back to the second inputs of the first mixer; the outputs of the second mixer are coupled to the second inputs of the second mixer; the outputs of the third mixer are tied together with the outputs of the first mixer to form the in-phase outputs of the divider, and then coupled to the second inputs of the fourth mixer; similarly, the outputs of the fourth mixer are combined with the outputs of the second mixer to form the quadrature-phase outputs of the divider, and then fed-back to the second inputs of the third mixer.

The operation is the same as that described in FIG. 11, except that differential analog mixer and differential signals are used.

The differential analog mixers can be any of differential mixers with first differential inputs and second differential inputs, such as a differential Gilbert Cell mixer or similar design.

Figure 15:
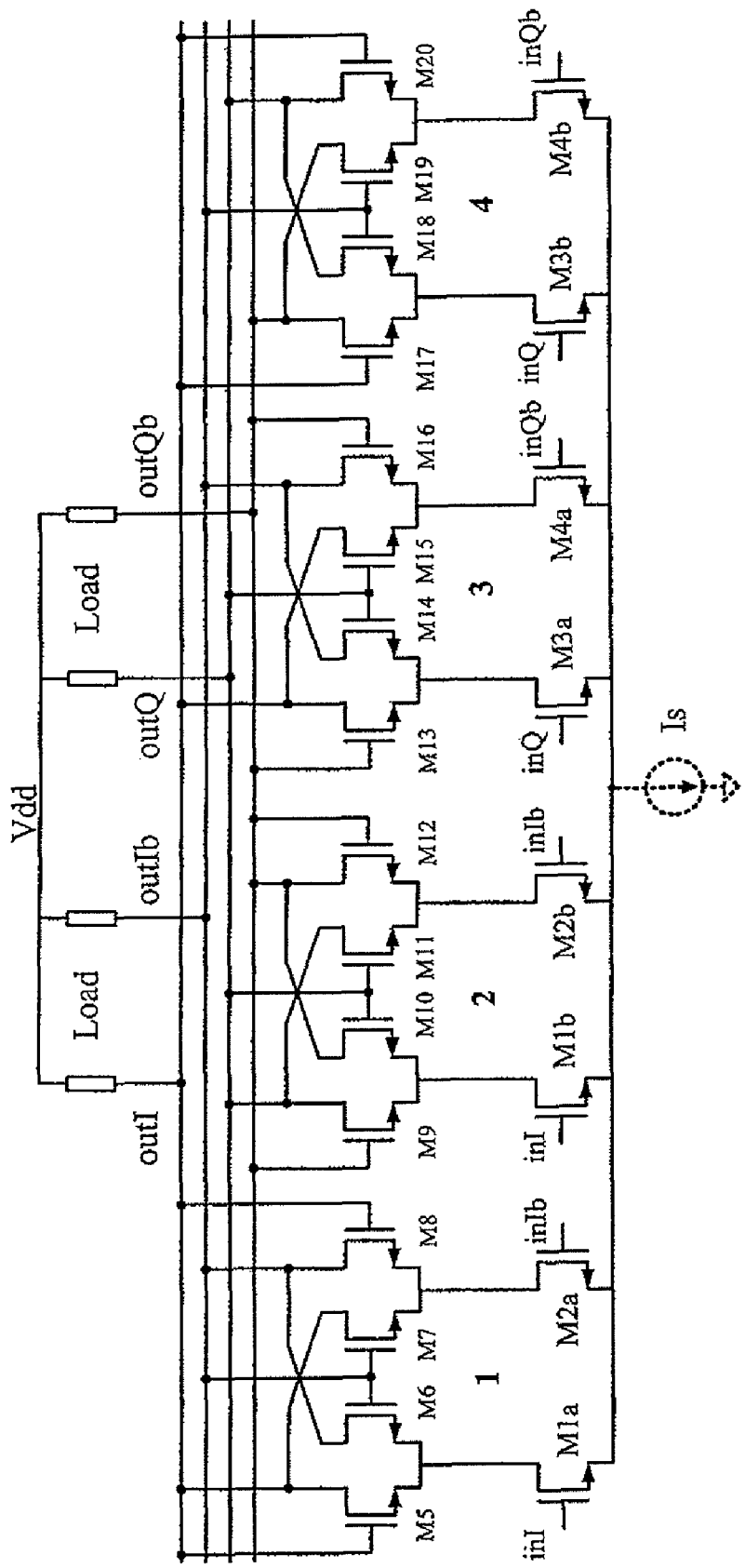
FIG. 15 shows a QIQO divider implemented by a Gilbert Cell.

FIG. 15 illustrates a detailed example of an implementation of the embodiment of FIG. 13, in which differential Gilbert Cell mixers are used as the analog mixers. The quadrature input signals at predetermined frequency of two times of the output frequency are applied at bottom transistors M1$a,b$-M4$a,b$ of the mixers. Thereof, the quadrature output signals of the QIQOD are coupled to the switching transistors M5-M20 of the mixers following the rules explained in FIG. 13. As will be appreciated by a person skilled in the art, it would be possible to modify the arrangement of FIG. 15 to implement the configuration of any of FIG. 11-12 or 14, instead of FIG. 13.

The current bias Is can be included or omitted. Either resistive-load or inductive-load can be implemented which depended on the operation frequency requirement.

Figure 16:
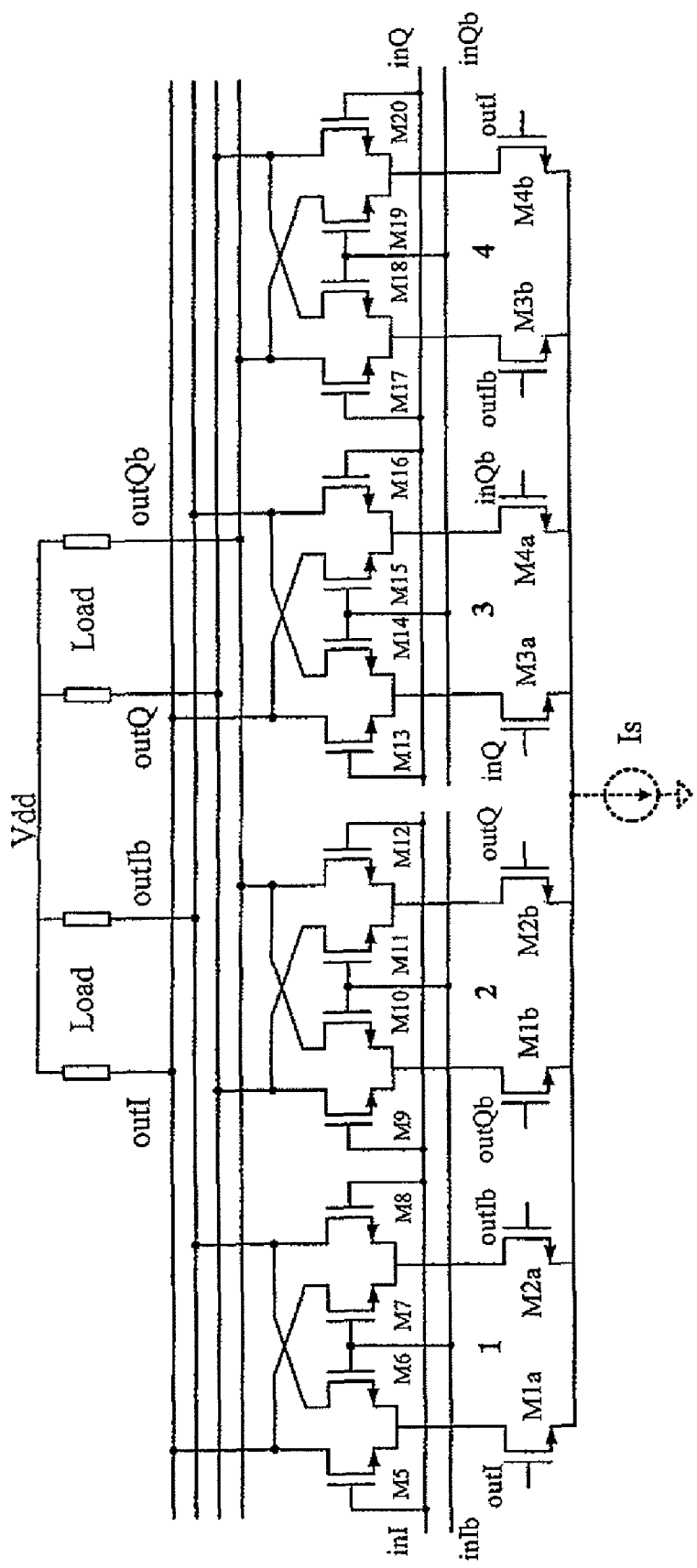
FIG. 16 shows a further example of a QIQO divider implemented by a Gilbert Cell.

FIG. 16 illustrates a second example of the present invention comprising differential Gilbert Cell mixers. The quadrature input signals at predetermined frequency of two times of the output frequency are applied at switching transistors M5-M20 of the mixers. Thereof, the quadrature output signals of the QIQOD are coupled to the bottom transistors M1$a,b$-M4$a,b$ of the mixers following the rules explained in FIG. 13. As will be appreciated by a person skilled in the art, it would be possible to modify the arrangement of FIG. 16 to implement the configuration of any of FIG. 11-12 or 14, instead of FIG. 13.

The current bias Is can be included or omitted. Either resistive-load or inductive-load can be implemented which depended on the operation frequency requirement.

Figure 17:
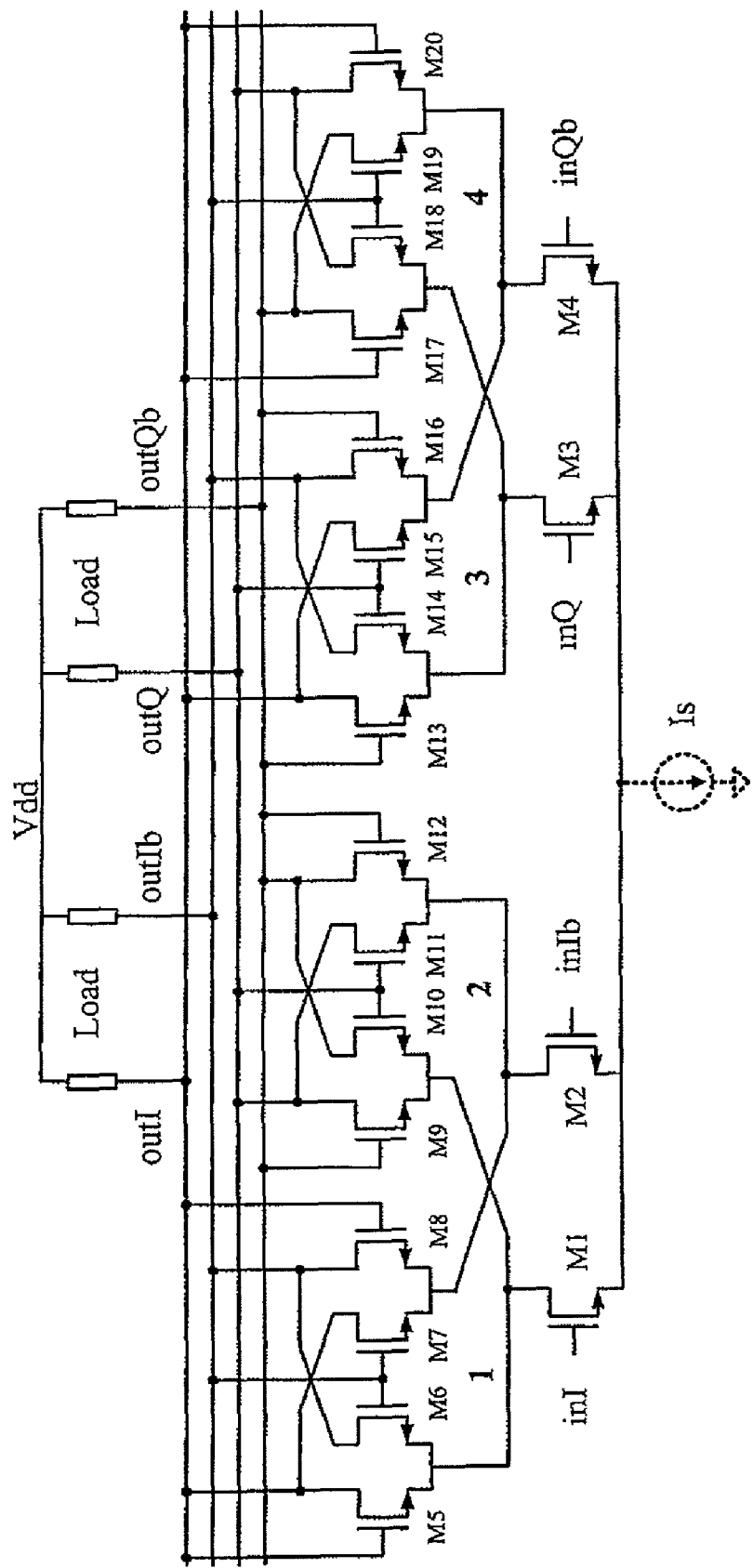
FIG. 17 shows a further example of a QIQO divider implemented by a Gilbert Cell.

FIG. 17 illustrates a third example of the present invention comprising differential Gilbert Cell mixers. The quadrature input signals at predetermined frequency of two times of the output frequency are applied at bottom transistors M1-M4 of the mixers. Whereas, the bottom transistors of the first and the second mixers are combined; and the bottom transistors of the third and the fourth mixers are combined. Thereof, the quadrature output signals of the QIQOD are coupled to the switching transistors M5-M20 of the mixers following the rules explained in FIG. 13. As will be appreciated by a person skilled in the art, it would be possible to modify the arrangement of FIG. 17 to implement the configuration of any of FIG. 11-12 or 14, instead of FIG. 13.

The current bias Is can be included or omitted. Either resistive-load or inductive-load can be implemented which depended on the operation frequency requirement.

Figure 18:
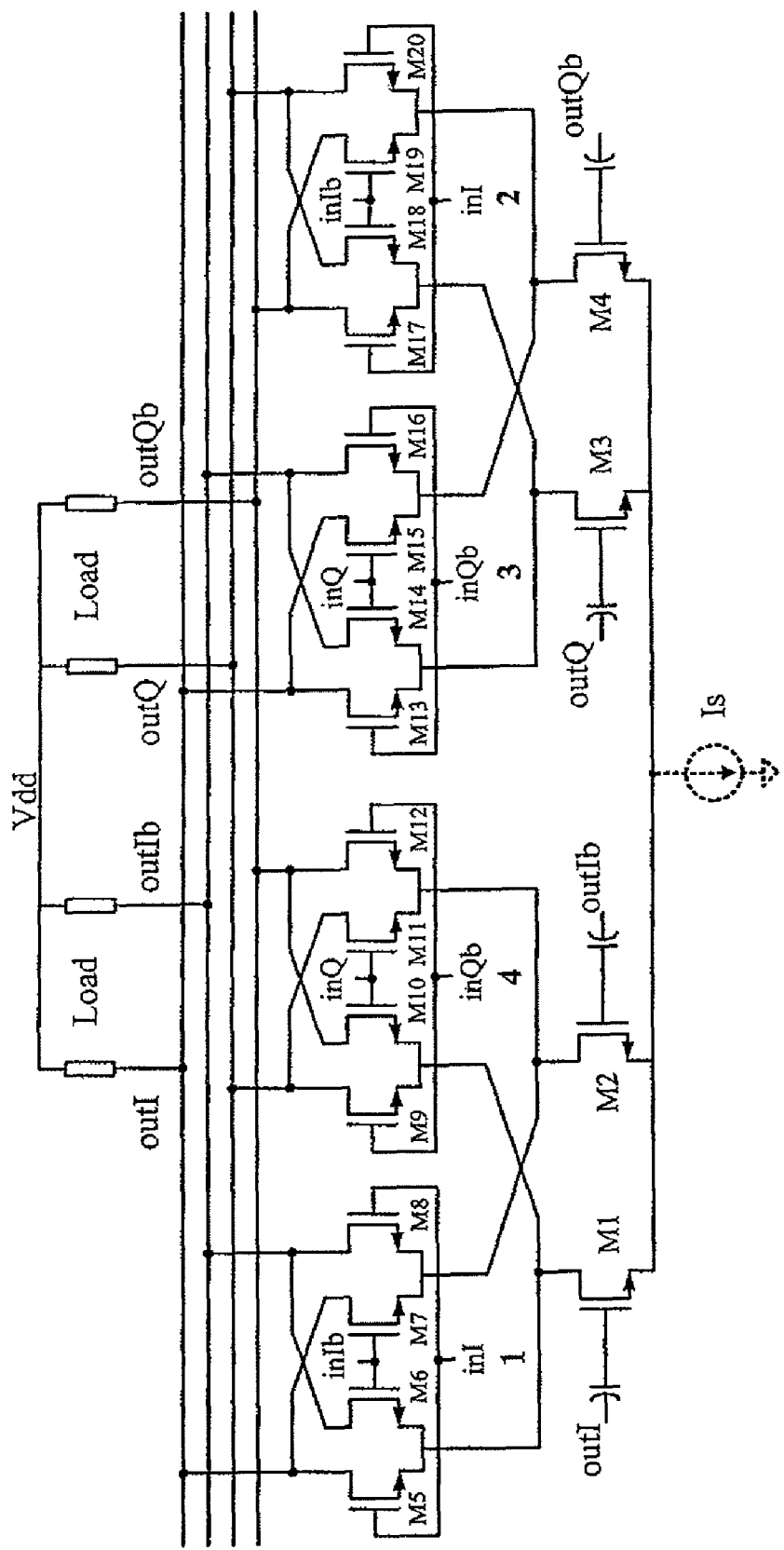
FIG. 18 shows a further example of a QIQO divider implemented by a Gilbert Cell.

FIG. 18 illustrates a fourth example of the present invention comprising differential Gilbert Cell mixers. The quadrature input signals at predetermined frequency of two times of the output frequency are applied at switching transistors M5-M20 of the mixers. Thereof, the quadrature output signals of the QIQOD are coupled to the bottom transistors M1-M4 of the mixers following the rules explained in FIG. 13. Whereas, the bottom transistors of the first and the fourth mixers are combined; and the bottom transistors of the second and the third mixers are combined. As will be appreciated by a person skilled in the art, it would be possible to modify the arrangement of FIG. 18 to implement the configuration of any of FIG. 11-12 or 14, instead of FIG. 13.

The current bias Is can be included or omitted. Either resistive-load or inductive-load can be implemented which depended on the operation frequency requirement.

Figure 19:
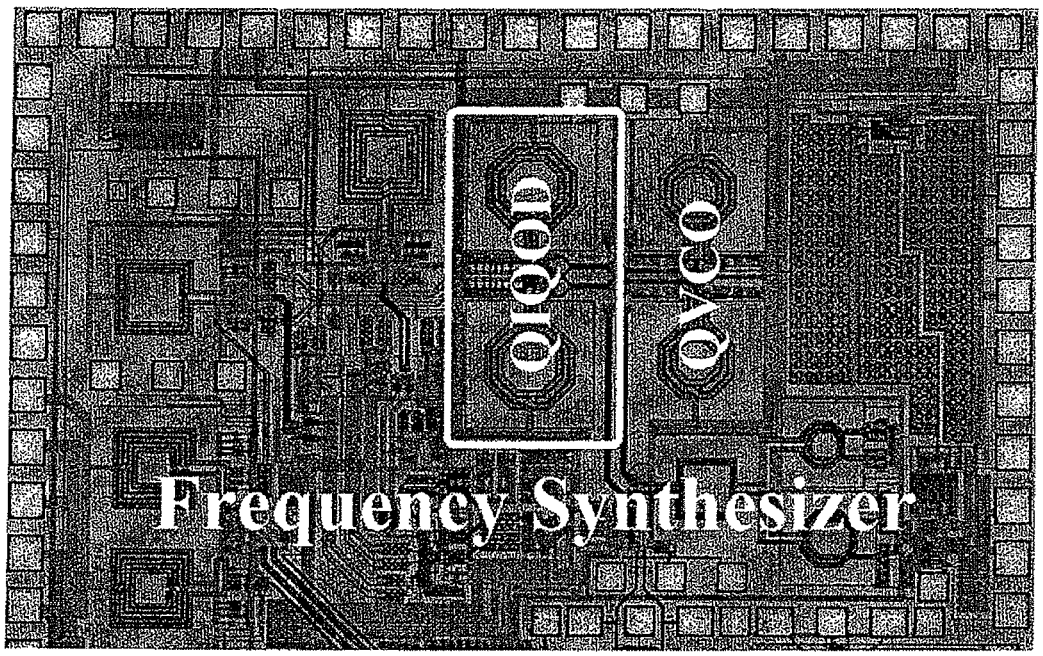
FIG. 19 is shows a frequency synthesizer chip having a QVCO and a QIQO divider.

To demonstrate the present invention of the quadrature-input quadrature-output divider, a QIQOD having the configuration as shown in FIG. 17 is designed and fabricated in a 0.18-μm CMOS process ($V_{Tn}$=0.52 V, $V_{Tp}$=−0.54 V) with 6 metal layers. The invented QIQOD is implemented in a practice frequency synthesizer system which is designed for UWB transceivers. Here, the LC tank is chosen to achieve high-frequency operation. FIG. 19 is a photograph of a frequency synthesizer which comprises the QIQOD as described above and a QVCO.

The embodiments of the invention have been described above by way of example only. As will be an apparent person skilled in the art, it may be possible to make varies modifications and alterations to the circuits described above, while still remaining within the scope and spirit of the invention as defined by the claims. Examples of some simple variations are shown in FIGS. 20-25. However, these are not meant to be a comprehensive listing, as other variations may exist.

Figure 20:
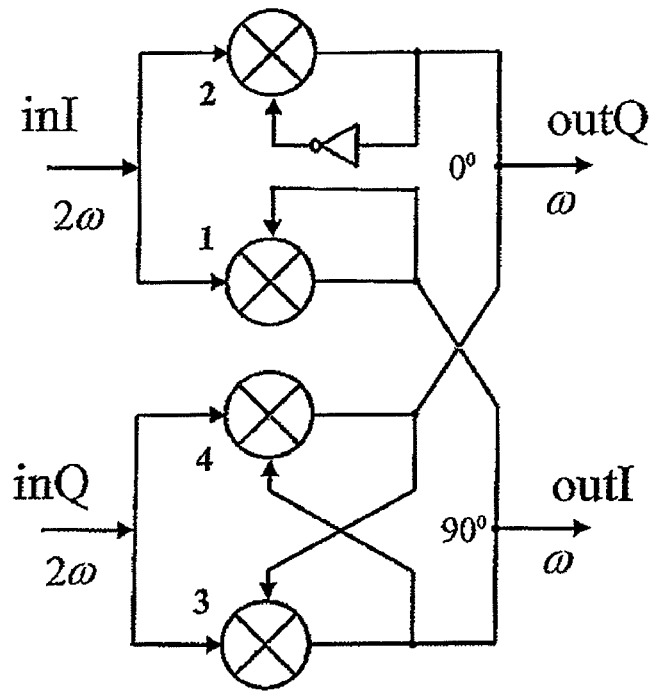
FIG. 20 shows a further example of a QIQO divider.

In FIG. 20 the position of the first 1 and second 2 mixers is reversed. The position of the third and fourth mixers is also reversed. This means that the upper quadrature output becomes the quadrature-phase output OutQ because of the influence of the 180° phase shift on the second mixer's second input.

Figure 21:
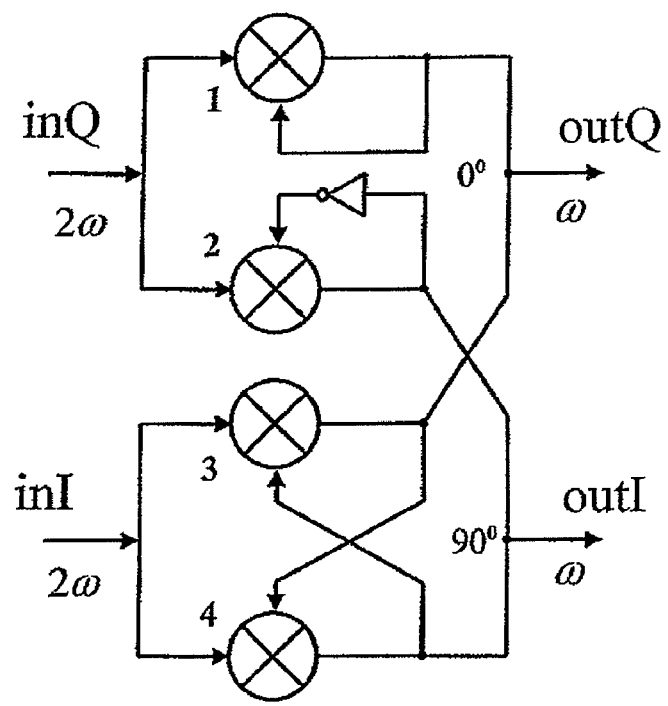
FIG. 21 shows a further example of a QIQO divider.

In FIG. 21 the input signals are reversed so that the quadrature-phase input is input to the first 1 and second 2 mixers and the in-phase input is input to the third 3 and fourth 4 mixers. This makes essentially no difference because the quadrature-phase input may be either advanced or delayed relative to the in-phase input by 90°, so designating one of the inputs as "in-phase" is purely arbitrary. The important point is that there is a defined relationship between the phases of the quadrature inputs and that the phase relationship is maintained for the corresponding quadrature outputs. So, for example if the quadrature-phase input inQ is delayed relative to the in-phase input inI by 90°, then the quadrature-phase output outQ is delayed relative to the in-phase output outI by 90° also.

Figure 22:
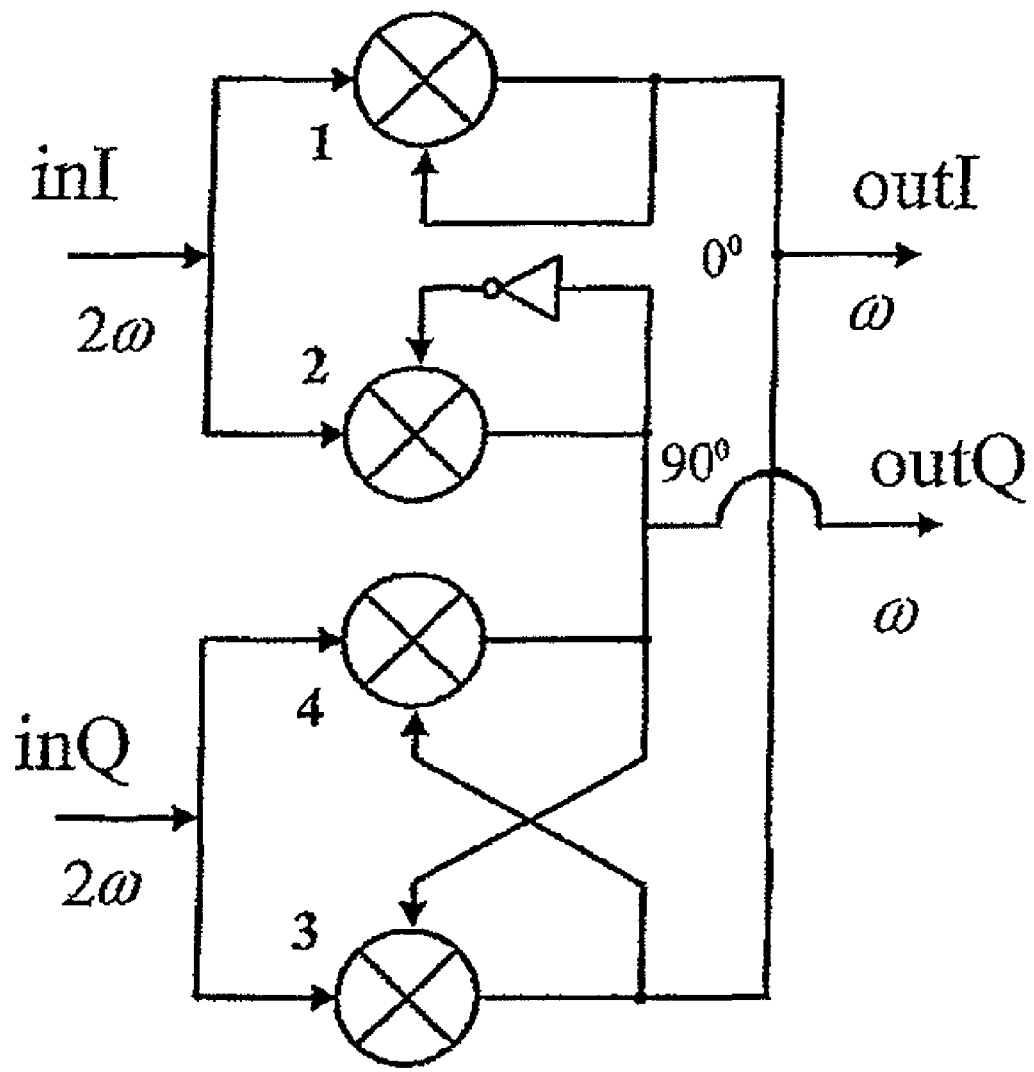
FIG. 22 shows a further example of a QIQO divider.

In FIG. 22 the position of the third 3 and fourth 4 mixers is swapped. However, the same relationship between the mixers is kept, so that the output of the second 2 and fourth 4 mixers is combined and the output of the first 1 and third 3 mixers is combined as in previous examples.

It is necessary that one of the mixers in the first pair of mixers has a path, leading to one of its inputs, phase shifted by 180°. For easy reference we have consistently refer to this mixer as the "second mixer 2". The paths leading to the other mixer in the first pair "the first mixer 1" should not be phase-shifted, or should be phase-shifted by an even number of 180-degree phase shifts. For example, both the first and the second inputs to the first mixer could be inverted (this is not shown in the diagrams, but would be easy to implement). Meanwhile, the outputs of the second pair of mixers (mixers 3 and 4) should be cross-coupled. There should be no-phase shifts or an even number of 180-degree phase shifts on the paths leading to the input of the third 3 and fourth 4 mixers.

Figure 23:
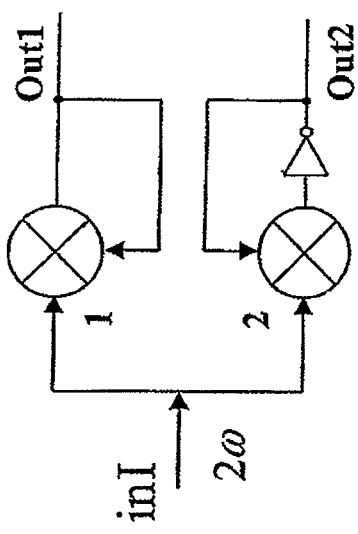
FIG. 23 shows an alternative arrangement for the input side of a QIQO divider.
Figure 23:
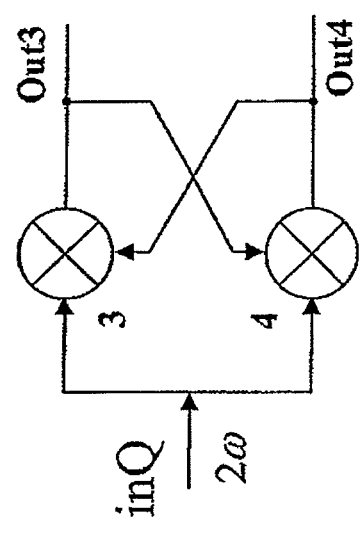
Figure 24:
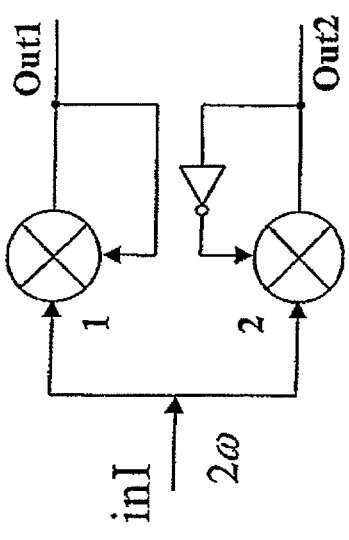
FIG. 24 shows another alternative arrangement for the input side of a QIQO divider.
Figure 24:
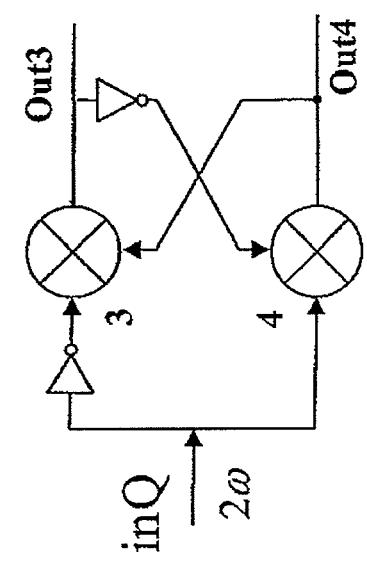
Figure 25:
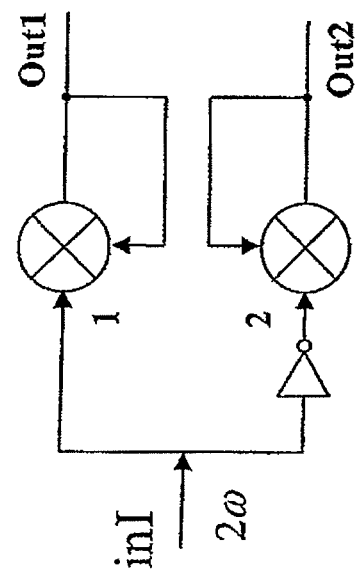
FIG. 25 shows another alternative arrangement for the input side of a QIQO divider.
Figure 25:
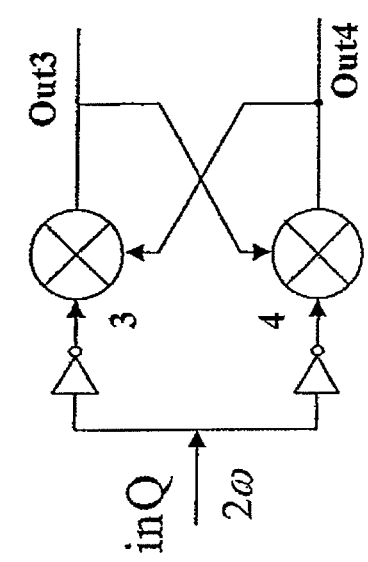

FIGS. 23, 24, and 25 show examples of three different possible configurations for the input side of the quadrature-input-quadrature-output divider. The output side would be the same as that is illustrated in FIG. 10. In FIG. 23 there is an inverter just after the output of the second mixer 2 (which combines with the output of the fourth mixer 4 and also feeds back to the second input of the second mixer 2), rather than being on only the feedback portion of the path as in FIG. 10. In FIG. 24 the configuration is the same as FIG. 10, except that there are two 180° phase shifts on the input paths to the third 3 and fourth 4 mixers; specifically a 180° phase shift on the first input to the third mixer 3 and a 180° phase shift on the feedback path to the second input of the fourth mixer 4.

In FIG. 25 there are also two 180° phase shifts on the input paths to the third and fourth mixers. In this case the phase shifts are on the first input of third mixer and first input of the fourth mixer. The rest of the circuit is the same as in FIG. 12.

The invention claimed is:

1. A quadrature-input quadrature-output divider, comprising:
    an in-phase input configured to receive an in-phase input signal;
    a quadrature-phase input configured to receive a quadrature-phase input signal;
    an in-phase output configured to output an in-phase signal;
    a quadrature-phase output configured to output a quadrature-phase signal; and
    first, second, third, and fourth analog mixers, each comprising first and second inputs and an output, wherein:
        the first input of the first analog mixer is configured to receive the in-phase input signal;
        the first input of the second analog mixer is configured to receive the in-phase input signal;
        the first input of the third analog mixer is configured to receive the quadrature-phase input signal;
        the first input of the fourth analog mixer is configured to receive the quadrature-phase input signal;
        the output of the first analog mixer is configured to be fed back to the second input of the first analog mixer;
        the output of the second analog mixer is configured to be fed back to the second input of the second analog mixer;
        the signal input to one of the first and second inputs of the second analog mixer is configured to be phase shifted by 180 degrees;
        the output of the third analog mixer is configured to be combined with the output of the first analog mixer;
        the combined signal from the first and third analog mixers is configured to be directed to the in-phase output of the quadrature-input quadrature-output divider and fed back to the second input of the fourth analog mixer;
        the output of the fourth analog mixer is configured to be combined with the output of the second analog mixer; and
        the combined output of the second and fourth analog mixers is configured to be directed to the quadrature-phase output of the quadrature-input quadrature-output divider and fed-back to the second input of the third analog mixer.

2. The quadrature-input quadrature-output divider of claim 1, further comprising an inverter between the in-phase input and the first input of the second analog mixer.

3. The quadrature-input quadrature-output divider of claim 1, further comprising an inverter on a path between the output of the second analog mixer and the second input of the second analog mixer.

4. The quadrature-input quadrature-output divider of claim 1, wherein the inputs and outputs of the first, second, third, and fourth mixers comprise differential inputs and outputs, and wherein the in-phase and quadrature-phase inputs and outputs of the quadrature-input quadrature-output divider comprise differential inputs and outputs.

5. The quadrature-input quadrature-output divider of claim 4, wherein the differential output of the second analog mixer is configured to be cross-coupled to the second differential input of the second analog mixer.

6. The quadrature-input quadrature-output divider of claim 4, wherein the differential in-phase input of the quadrature-input quadrature-output divider is configured to be cross-coupled to the first differential input of the second analog mixer.

7. The quadrature-input quadrature-output divider of claim 1, wherein the first, second, third, and fourth mixers comprise Gilbert-Cell mixers.

8. The quadrature-input quadrature-output divider of claim 4, wherein the first, second, third, and fourth mixers comprise differential Gilbert-Cell mixers.

9. The quadrature-input quadrature-output divider of claim 7, wherein the Gilbert-Cell mixers each comprise a bottom transistor and a pair of switching transistors.

10. The quadrature-input quadrature-output divider of claim 9, wherein the quadrature-phase and in-phase inputs are configured to be coupled to the bottom transistors of the first, second, third, and fourth mixers, and wherein the quadrature-phase and in-phase outputs are configured to be coupled to the switching transistors of the first, second, third, and fourth mixers.

11. A phase locked loop or synthesizer, comprising:
a voltage controlled oscillator (VCO); and
a feedback loop, wherein:
the phase locked loop or synthesizer is configured to output a quadrature signal; and
the feedback loop comprises one or more quadrature-input quadrature-output dividers, wherein at least one of the quadrature-input quadrature-output dividers comprises:
an in-phase input configured to receive an in-phase input signal;
a quadrature-phase input configured to receive a quadrature-phase input signal;
an in-phase output configured to output an in-phase signal;
a quadrature-phase output configured to output a quadrature-phase signal; and
first, second, third, and fourth analog mixers, each comprising first and second inputs and an output, wherein:
the first input of the first analog mixer is configured to receive the in-phase input signal;
the first input of the second analog mixer is configured to receive the in-phase input signal;
the first input of the third analog mixer is configured to receive the quadrature-phase input signal;
the first input of the fourth analog mixer is configured to receive the quadrature-phase input signal;
the output of the first analog mixer is configured to be fed back to the second input of the first analog mixer;
the output of the second analog mixer is configured to be fed back to the second input of the second analog mixer;
the signal input to one of the first and second inputs of the second analog mixer is configured to be phase shifted by 180 degrees;
the output of the third analog mixer is configured to be combined with the output of the first analog mixer;
the combined signal from the first and third analog mixers is configured to be directed to the in-phase output of the at least one of the quadrature-input quadrature-output dividers and fed back to the second input of the fourth analog mixer;
the output of the fourth analog mixer is combined with the output of the second analog mixer; and
the combined output of the second and fourth analog mixers is configured to be directed to the quadrature-phase output of the at least one of the quadrature-input quadrature-output dividers and fed-back to the second input of the third analog mixer.

12. The phase locked loop or synthesizer of claim 11, wherein the VCO comprises a quadrature VCO which outputs a quadrature signal.

13. The phase locked loop or synthesizer of claim 11, wherein the VCO output is coupled to a quadrature signal generator, and wherein the output of the quadrature signal generator is coupled to the output of the phase locked loop or synthesizer and to at least one of the quadrature-input quadrature-output dividers of the feedback loop.

14. The phase locked loop or synthesizer of claim 11, further comprising an inverter between the in-phase input and the first input of the second analog mixer.

15. The phase locked loop or synthesizer of claim 11, further comprising an inverter on a path between the output of the second analog mixer and the second input of the second analog mixer.

16. The phase locked loop or synthesizer of claim 11, wherein the inputs and outputs of the first, second, third, and fourth analog mixers comprise differential inputs and outputs, and wherein the in-phase and quadrature-phase inputs and outputs of the divider comprise differential inputs and outputs.

17. The phase locked loop or synthesizer of claim 16, wherein the differential output of the second analog mixer is cross-coupled to the second differential input of the second analog mixer.

18. The phase locked loop or synthesizer of claim 16, wherein the differential in-phase input of the divider is cross-coupled to the first differential input of the second analog mixer.

19. The phase locked loop or synthesizer of claim 11, wherein the first, second, third, and fourth mixers comprise Gilbert-Cell mixers.

20. The phase locked loop or synthesizer of claim 19, wherein the first, second, third, and fourth mixers comprise differential Gilbert-Cell mixers.

21. The phase locked loop or synthesizer of claim 19, wherein the Gilbert-Cell mixers each comprise a bottom transistor and a pair of switching transistors.

22. The phase locked loop or synthesizer of claim 21, wherein the quadrature-phase and in-phase inputs are configured to be coupled to the bottom transistors of the first, second, third, and fourth mixers, and wherein the quadrature-phase and in-phase outputs are configured to be coupled to the switching transistors of the first, second, third, and fourth mixers.

23. A circuit, comprising:
a single side band (SSB) mixer and a quadrature-input quadrature-output (QIQO) divider, wherein:
the SSB mixer has a first quadrature input configured to receive a first quadrature signal and a second quadrature input configured to receive a second quadrature signal;
the circuit is configured such that the first quadrature signal is input to both the first quadrature input of the SSB mixer and the quadrature input of the QIQO divider; and
the quadrature output of the QIQO divider is configured to form the second quadrature signal which is to be input to the second quadrature input of the SSB mixer;
wherein the QIQO divider comprises a divider including:
an in-phase input configured to receive an in-phase input signal;
a quadrature-phase input configured to receive a quadrature-phase input signal;
an in-phase output configured to output an in-phase signal;
a quadrature-phase output configured to output a quadrature-phase signal; and
first, second, third, and fourth analog mixers, each comprising first and second inputs and an output, wherein:
the first input of the first analog mixer is configured to receive the in-phase input signal;
the first input of the second analog mixer is configured to receive the in-phase input signal;
the first input of the third analog mixer is configured to receive the quadrature-phase input signal;
the first input of the fourth analog mixer is configured to receive the quadrature-phase input signal;
the output of the first analog mixer is configured to be fed back to the second input of the first analog mixer;
the output of the second analog mixer is configured to be fed back to the second input of the second analog mixer;
the signal input to one of the first and second inputs of the second analog mixer is configured to be phase shifted by 180 degrees;
the output of the third analog mixer is configured to be combined with the output of the first analog mixer;
the combined signal from the first and third analog mixers is configured to be directed to the in-phase output of the divider and fed back to the second input of the fourth analog mixer;
the output of the fourth analog mixer is configured to be combined with the output of the second analog mixer; and
the combined output of the second and fourth analog mixers is configured to be directed to the quadrature-phase output of the divider and fed back to the second input of the third analog mixer.

24. A method, comprising:
receiving, by a quadrature-input quadrature-output (QIQO) divider, a first input signal having an input frequency and a first input signal phase;
receiving, by the QIQO divider, a second input signal having the input frequency and a second input signal phase differing from the first input signal phase by approximately 90 degrees;
outputting, by the QIQO divider, a first output signal having a first output phase and a second output signal having a second output phase, wherein the first output signal and the second output signal have an output frequency, and wherein the second output phase differs from the first output phase by approximately 90 degrees; and
controlling, by the QIQO divider, the first output signal and the second output signal to cause either the first output signal or the second output signal to deterministically lag the other in phase based on whether the first input signal lags the second input signal in phase;
wherein:
said receiving of the first input signal is performed by a first input of a first mixer of the QIQO divider and a first input of a second mixer of the QIQO divider; and
said receiving of the second input signal is performed by a first input of a third mixer of the QIQO divider and a first input of a fourth mixer of the QIQO divider;
wherein the method further comprises:
feeding back an output of the first mixer to a second input of the first mixer;
feeding back an output of the second mixer to a second input of the second mixer;
phase shifting either the first or second input of the second mixer;
combining the output of the first mixer with an output of the third mixer to output the first output signal;
combining the output of the second mixer with an output of the fourth mixer to output the second output signal;
feeding back the first output signal into a second input of the fourth mixer; and
feeding back the second output signal into a second input of the third mixer.

25. The method of claim 24, wherein said controlling comprises causing the first output signal to lag the second output signal in phase if the first output signal does not lag the second output signal in phase.

26. The method of claim 24, wherein the output frequency is an integer fraction of the input frequency.

* * * * *

UNITED STATES PATENT AND TRADEMARK OFFICE
CERTIFICATE OF CORRECTION

PATENT NO. : 8,140,039 B2
APPLICATION NO. : 11/852702
DATED : March 20, 2012
INVENTOR(S) : Luong et al.

It is certified that error appears in the above-identified patent and that said Letters Patent is hereby corrected as shown below:

On the title page, item (56), under "OTHER PUBLICATIONS", in Column 2, Line 3, delete "2005, 2005 IEEE," and insert -- 2005, IEEE, --, therefor.

On the title page, item (57), under "ABSTRACT", in Column 2, Line 10, delete "determinisitic" and insert -- deterministic --, therefor.

In Column 2, Line 28, delete "or" and insert -- $\omega$ --, therefor.

In Column 4, Line 58, delete "Gilber-Cell" and insert -- Gilbert-Cell --, therefor.

In Column 6, Line 5, delete "DESCRIPTION" and insert -- BRIEF DESCRIPTION --, therefor.

In Column 7, Line 22, delete "in Q" and insert -- inQ --, therefor.

In Column 7, Line 39, delete "$\phi-2\phi_1$" and insert -- $\phi-2\varphi_1$ --, therefor.

In Column 7, Line 42, in Equation (2), delete "$\phi-2\phi_1+\beta=0$" and insert -- $\phi-2\varphi_1+\beta=0$ --, therefor.

In Column 7, Line 46, in Equation (3), delete "$\phi_1=(\beta+\phi)/2$" and insert -- $\varphi_1=(\beta+\phi)/2$ --, therefor.

In Column 7, Line 60, in Equation (5), delete "$\phi_2=(\beta+\phi)/2+\pi/2=\phi_1+\pi/2$" and insert -- $\varphi_2=(\beta+\phi)/2+\pi/2=\varphi_1+\pi/2$ --, therefor.

Signed and Sealed this
Fourth Day of September, 2012

David J. Kappos
*Director of the United States Patent and Trademark Office*

CERTIFICATE OF CORRECTION (continued)
U.S. Pat. No. 8,140,039 B2

In Column 8, Line 5, in Equation (7), delete "$\phi_2=(\beta+\phi)/2-\pi/2=\phi_1-\pi/2$" and insert -- $\varphi_2 = (\beta+\phi)/2 - \pi/2 = \varphi_1 - \pi/2$ --, therefor.

In Column 8, Line 35, in Equation (11), delete "$\phi_3=(\beta+\phi)/2=\phi_1$" and insert -- $\varphi_3 = (\beta+\phi)/2 = \varphi_1$ --, therefor.

In Column 8, Line 59, in Equation (14), delete "$I_{L1}+I_{L3}=V_{in}V_o \cos(\omega t+\phi-\phi_1)=V_{in}V_o \cos(\omega t+\phi/2-\beta/2)$" and insert -- $I_{L1}+I_{L3}=V_{in}V_o \cos(\omega t+\phi-\varphi_1)=V_{in}V_o \cos(\omega t+\phi/2-\beta/2)$ --, therefor.

In Column 10, Line 30, delete "FIG. 11-12 or 14," and insert -- FIGS. 11-12 or 14, --, therefor at each occurrence throughout the specification.

In Column 11, Line 48, delete "in Q" and insert -- inQ --, therefor.